(12) United States Patent
Yang et al.

(10) Patent No.: US 7,598,533 B2
(45) Date of Patent: Oct. 6, 2009

(54) HIGH HEAT DISSIPATING LED HAVING A POROUS MATERIAL LAYER

(75) Inventors: Chun Chieh Yang, Hsinchu Hsien (TW); Hong-Xi Cao, Hsinchu (TW); Chia-Tai Kuo, Hsinchu (TW); Chih-Li Chen, Hsinchu (TW); Cheng-Fa Chen, Hsinchu (TW); Ji-Bin Horng, Hsinchu (TW)

(73) Assignee: Industrial Technology Research Institute, Hsinchu Hsien (TW)

(*) Notice: Subject to any disclaimer, the term of this patent is extended or adjusted under 35 U.S.C. 154(b) by 0 days.

(21) Appl. No.: 11/415,150

(22) Filed: May 2, 2006

(65) Prior Publication Data

US 2006/0243997 A1 Nov. 2, 2006

(30) Foreign Application Priority Data

May 2, 2005 (TW) .............................. 94114090 A

(51) Int. Cl.
*H01L 33/00* (2006.01)
*H01L 31/0256* (2006.01)

(52) U.S. Cl. .................... 257/98; 257/79; 257/103

(58) Field of Classification Search ................ 257/79, 257/98, 103, E31.013, E33.018; 438/22; 313/498
See application file for complete search history.

(56) References Cited

U.S. PATENT DOCUMENTS

| | | | |
|---|---|---|---|
| 5,919,329 A * | 7/1999 | Banks et al. ................ 156/281 |
| 6,084,252 A | 7/2000 | Isokawa et al. | |
| 6,274,924 B1 | 8/2001 | Carey et al. | |
| 6,637,921 B2 | 10/2003 | Coushaine | |
| 6,705,393 B1 | 3/2004 | Hsu | |
| 6,739,047 B2 * | 5/2004 | Hammond et al. ............ 29/847 |
| 6,830,496 B2 | 12/2004 | Lin et al. | |
| 6,936,855 B1 * | 8/2005 | Harrah ........................ 257/88 |
| 2003/0151361 A1 * | 8/2003 | Ishizaka ...................... 313/512 |
| 2003/0160247 A1 * | 8/2003 | Miyazawa ..................... 257/79 |
| 2004/0104390 A1 * | 6/2004 | Sano et al. ..................... 257/78 |
| 2005/0274959 A1 * | 12/2005 | Kim et al. ...................... 257/79 |
| 2006/0261364 A1 * | 11/2006 | Suehiro et al. ............... 257/100 |
| 2007/0048179 A1 * | 3/2007 | Fujita et al. .................... 422/57 |

FOREIGN PATENT DOCUMENTS

| TW | 213446 | 9/1993 |
|---|---|---|
| TW | 220351 | 2/1994 |
| TW | 213446 | 9/2003 |
| TW | 220351 | 1/2004 |

* cited by examiner

*Primary Examiner*—Lynne A. Gurley
*Assistant Examiner*—Vernon P Webb
(74) *Attorney, Agent, or Firm*—Rabin & Berdo, P.C.

(57) ABSTRACT

A high power LED has at least a porous material layer, a thermal conductive layer and a chip. The thermal conductive layer is disposed on the surface of the porous material layer and the chip is disposed on the thermal conductive layer. Heat generated by the chip is conducted from the thermal conductive layer to the porous material layer, and convected outside via the porous material layer. Thereby, surface area in contact with the air is increased and high thermal conductivity and high heat convection are also achieved.

20 Claims, 8 Drawing Sheets

HIGH HEAT DISSIPATING LED HAVING A POROUS MATERIAL LAYER

FIELD OF THE INVENTION

The present invention relates to LEDs (Light Emitting Diodes), and more particularly, high-power heat-dissipating LEDs.

BACKGROUND OF THE INVENTION

The main principle of Light Emitting Diodes (LEDs) is by applying current to light emitting materials to achieve light emitting effect. In recent years, high-power LEDs bring LED light source applications into a whole new era. High-power LEDs are characterized by small size, high luminance of light and maximum light output per unit area, which eliminate the use of traditional LED arrays. Accordingly, the LED light source may provide better light source characteristics; and facilitate optical designs and applications. In the meantime, the small size and high luminance of the high-power LEDs open a new door for the LED light sources and also allow design of LED applications to be more flexible. Common applications include car lights, flash lights and other lighting applications with very small size and high power, as well as display applications such as LED backlight modules, project light sources, and outdoor displays. Moreover, current LED light-emitting efficiency is only 15% (external quantum efficiency), so most of the input energy converts to heat, which results in temperature rise. As shown in FIG. 1, the operating life of an LED that operates under high efficiency reduces with increase in temperature. The device may even fail due to overheating. Thus, heat dissipation needs to be taken into consideration in LED packaging, so as to allow the chip in the LED package to withstand more power, thereby increasing its luminance.

Generally, there are three ways of heat dissipation in LED packaging: conduction, convection and radiation, wherein the effect of radiation in dissipating heat is relatively limited. In a traditional LED heat dissipating system, the heat of an LED chip will first conduct to the external environment through the package. In order to improve the heat dissipation of a high-power LED package in the prior art, increasing the thermal conductivity of the conducting path is the main area of focus. As for the heat dissipating design for heat convection, metal fins or larger area of metal substrates are usually added to the whole system, so as to increase the surface area contacting the air. There is a large amount of related patents, for example, U.S. Pat. No. 6,274,924, No. 6,830,496, No. 6,739,047, No. 6,637,921, No. 6,084,252, No. 6,705,393 B1, and Taiwan Patent No. 213446 and 220351.

As an example, the U.S. Pat. No. 6,274,924 proposes a surface mountable LED package. As shown in FIG. 2, this patent is directed to adhering an LED chip 21 on a metal slug 23 for heat dissipation, such that heat can be conducted to the bottom of the package due to high thermal conductivity of the metal slug 23.

However, the contact area of the metal slug 23 and the air is limited. If the application is to meet the product standard, the package has to be further adhered to a metal fin, a metal substrate or other material with high thermal conductivity. However, such materials usually have a larger size. As a result, more spaces are occupied by such larger-area element or material with high thermal conductivity for increasing the surface area with area, which hinders the application of LEDs to small-size application. Meanwhile, since this conventional technique has to be connected to larger-sized heat dissipating substrate or using metal heat dissipating substrate or fin for heat dissipation. Thus, additional cost is required for circuit fabrication.

U.S. Pat. No. 6,739,047 discloses a method for forming a high-power device module. As shown in FIG. 4, module 6 employs a combining structure of a metal substrate 61 and a ceramic 63, both of which are good heat dissipating materials, to allow heat generated during operation of a chip 65 to be conducted via the surfaces of those two to air. The module is electrically connected to a motherboard 60. However, similar to the last patent, there is no design that increases the area that contacts the air.

U.S. Pat. No. 6,637,921 proposes a packaging system with swappable light sources. As shown in FIG. 5, the system is provided with a base plate 81 made of metal as the heat dissipating element and also support for LED light source 83. A plurality of denting heat dissipating structure is disposed on the rim of this system (i.e. the peripheral of the base plate 81) as heat dissipating fins to enhance convection of heat. However, such heat dissipating design is at the rim of the whole system, it also occupies a relatively large area and is difficult to apply to small-size products.

U.S. Pat. No. 6,084,252 teaches a semiconducting light emitting device that adds a base design with a special shape for heat dissipation to the package base of a conventional LED lamp. As shown in FIG. 6, the heat dissipating element 6 of this patent is provided with a plurality of curved indentations 101, which is one of a few that allows heat airflow to be guided into the LED package body. Although the curved indentations 101 of this patent allows the surface area contacting the air to be increased, but the location of the LED chip does not provide direct contact of the LED chip with the heat dissipating element 10 and its curved indentations 101.

In U.S. Pat. No. 6,705,393 B1, TW Patent No. 213446 and No. 220351, a ceramic structure with small pores is proposed, so as to increase heat convection for heat dissipation. However, the objective of this patent is to provide a ceramic heat dissipating element that dissipates heat during operation of a CPU of a computer. Nothing further is described on how the heat dissipating design is to be applied to LED packages.

From the above, it is clear that current high-power LED packages only concentrates on increasing the heat conduction from the junction of the LED chip to external of the package. Nonetheless, the heat in the whole system eventually has to be completely removed from the LED to outside of the system via air convection. Moreover, in the conventional designs using heat conduction and convection for heat dissipation, larger elements or other materials with high thermal conductivity need to be added, which occupies more space and impedes smaller-size applications.

Therefore, there is a need for high-power LEDs with high thermal conductivity and heat convection.

SUMMARY OF THE INVENTION

In the light of forgoing drawbacks, an objective of the present invention is to provide a high power LED that increases air-contact surface area and achieves high thermal conductivity and high heat convection.

Another objective of the present invention is to provide a high power LED that can be applied to small-size products.

Yet another objective of the present invention is to provide a high power LED that promotes industrial value.

In accordance with the above and other objectives, the present invention provides a high power LED, comprising: porous material layer; a thermal conductive layer disposed on a surface of the porous material layer; and a chip disposed on the thermal conductive layer, wherein heat generated by the chip is conducted from the thermal conductive layer to the porous material layer, and convected outside via the porous material layer.

Preferably, the porous material layer can be made of a concave-convex structure which has a surface area in a unit area projecting plane range at least twice the unit area. Wherein the porous material layer can be one selected from the group consisting of porous ceramic material, foam metal material, metal oxide and combinations thereof. The thermal conductive layer can be made of an electrically conducting material that has a thermal conductivity larger than that of the porous material layer, and the thermal conductive layer is preferably one selected from the group consisting of metal material, graphite material and diamond-like carbon material. Alternatively, the thermal conductive layer can be one selected from the group consisting of gold, silver, copper, aluminum, molybdenum, tungsten, iron, nickel, lead, graphite, diamond and composites thereof. The thermal conductive layer may selectively comprise a receiving portion as a platform for receiving the chip and an insulating portion for separating the thermal conductive layer into at least two insulated regions. The receiving portion may be in a bowl shape and separated into a plurality of electrodes by the insulating portion for polycrystalline use. The insulating portion may be a slit.

The high power LED of the present invention may further comprise a gold wire for connecting the chip to the electrodes and a light pervious insulating layer for encapsulating the chip and the gold wire. The light pervious insulating layer is a packaging gel. In one preferred embodiment, the present invention further comprising another porous material layer (e.g. a second porous material layer) partially covering a side of the thermal conductive layer that is away from the porous material layer (e.g. a first porous material layer). The another porous material layer may comprise an opening and an electrode region for external circuit connection. Meanwhile, the high power LED of the present invention may further comprise an interface layer between the porous material layer and/or the another porous material layer and the thermal conductive layer for adhering the porous material layer and/or the another porous material layer and the thermal conductive layer together. The interface layer can be made of an adhesive selected from the group consisting of epoxy material, silver gel and thermal conductive gel; or bumps; or a metal material selected from the group consisting of indium, tin and gold formed by a method selected from the group consisting of vapor deposition, sputtering and coating.

Compared to the prior art, the high power LED of the present invention allows heat generated by the chip to be conducted to the entire plane via the thermal conductive layer, then convected with airflow outside via the porous material layer(s) on the top and/or bottom of the thermal conductive layer. If the porous material layer is a conductor, an interface layer can be further disposed between the thermal conductive layer and the porous material layer. Thus, the present invention not only achieves the effect of conducting heat from the junction of the chip to outside of the package as in the prior art, but also increases efficiency of the air convection.

Since the present invention employs a conductive/insulating porous material layer and a thermal conductive layer separated into at least two regions insulated from each other, a plurality of independent conductive regions can thus be formed. During operation of the LED, the heat can be conducted in all directions via the thermal conductive layer with higher thermal conductivity, and then convected via the porous material layer combined to the thermal conductive layer, so as to reduce the temperature of the chip. In addition, the positive and negative electrodes of a single LED can be respectively connected to independent thermal conductive layer via conductive wires and to external power supply. This design can be applied to package body or module, and can be easily used to make new design or improve existing structures.

In this way, the high power LEDs according to the present invention eliminate the addition of large element or other materials with high thermal conductivity in the thermal conduction and convection design of prior art, improve the heat dissipation and easily fit into to the existing manufacturing process.

Thus, the high power LEDs of the present invention not only increases the surface area in contact with the air, but also achieves good thermal conduction and high heat convection. In addition, the present invention is applicable to small-size products.

BRIEF DESCRIPTION OF THE DRAWINGS

The present invention can be more fully understood by reading the following detailed description of the preferred embodiments, with reference made to the accompanying drawings, wherein:

FIGS. 8a and 8b are schematic diagrams depicting a kind of applicable porous material layer, wherein FIG. 8a shows the structure of a porous ceramic material layer, and FIG. 8b shows the appearance of the porous ceramic material;

DETAILED DESCRIPTION OF THE EMBODIMENTS

The present invention is described by the following specific embodiments. Those with ordinary skills in the arts can readily understand the other advantages and functions of the present invention after reading the disclosure of this specification. The present invention can also be implemented with different embodiments. Various details described in this specification can be modified based on different viewpoints and applications without departing from the scope of the present invention.

It should be noted that the high power LED of the present invention can be applied to package body or module, providing high power LED. Since the principle and structure (adhering, electrical conduction and encapsulation) of LEDs are well known in the art, only those directly related to the present invention are shown herein for simplicity and conciseness.

First Embodiment

Figure 7:
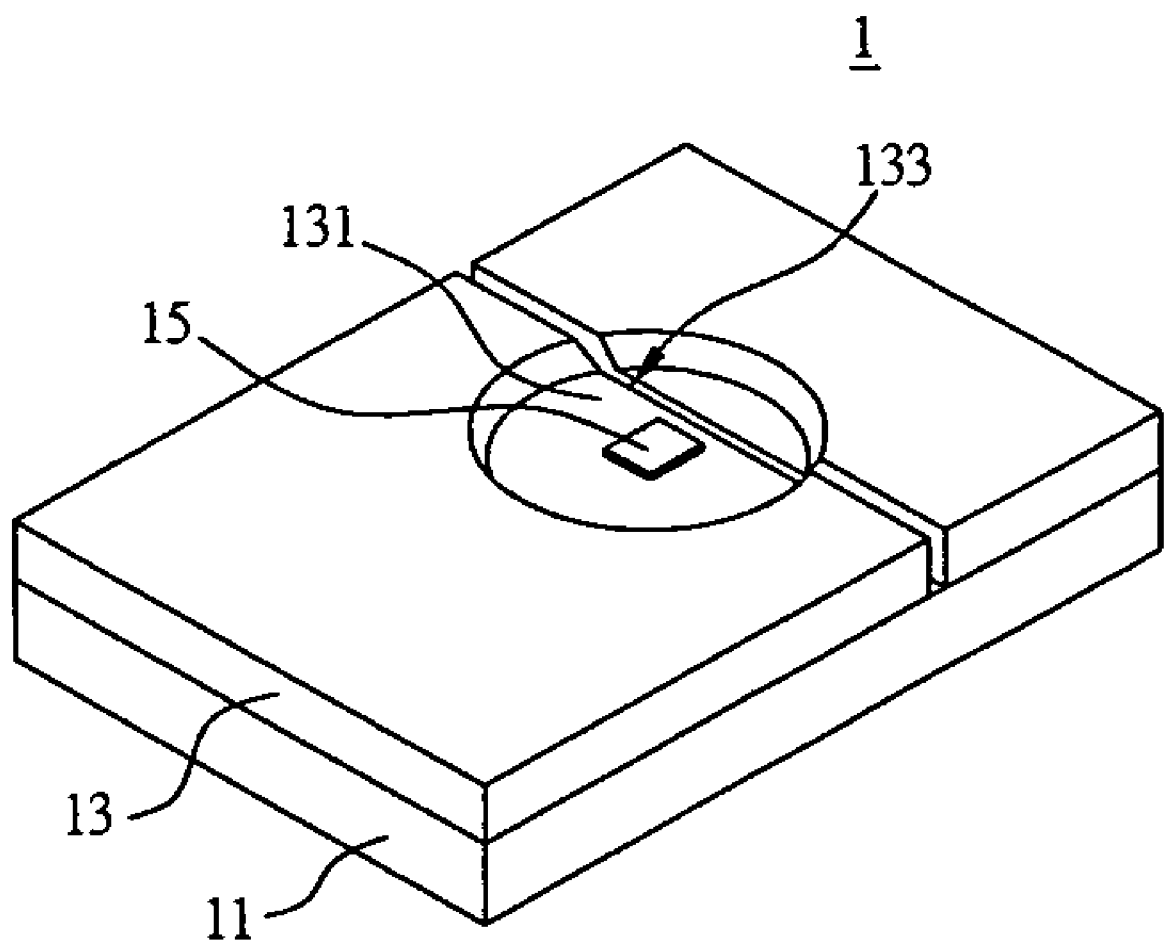
FIG. 7 is a schematic diagram of the first embodiment of the present invention.

FIGS. 7 to 10 are diagrams depicting a high power LED according to a first embodiment of the present invention. As shown in FIG. 7, the high power LED 1 of this embodiment includes a porous material layer 11, a thermal conductive layer 13 and a chip 15.

Figure 8A:
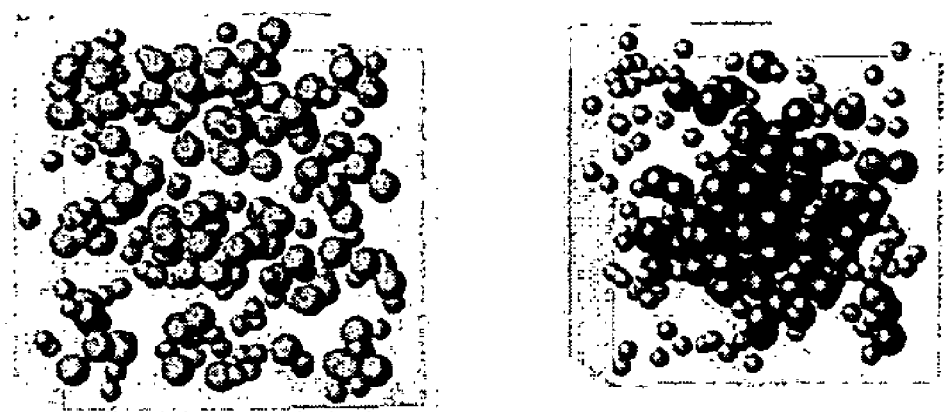
Figure 8:
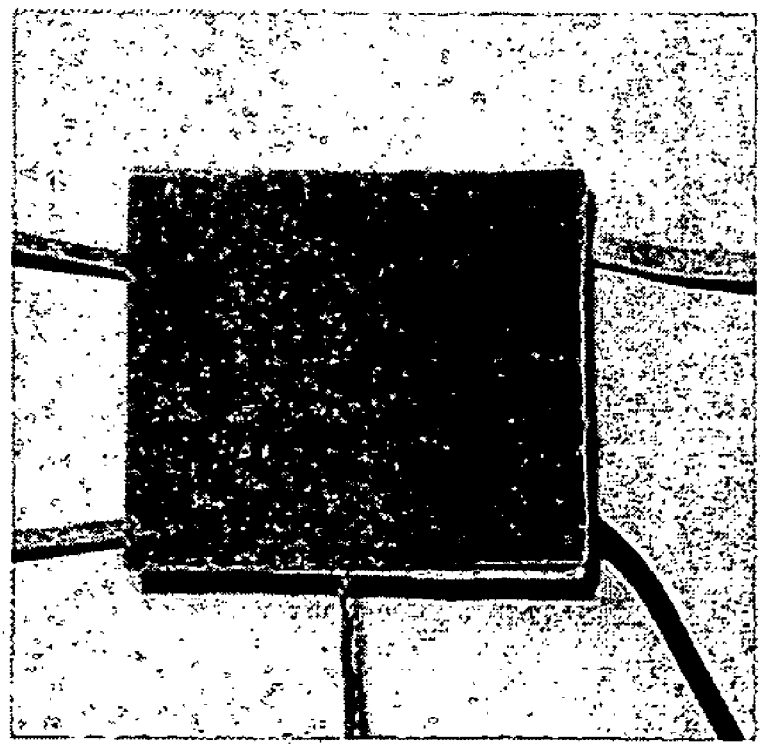
Figure 9:
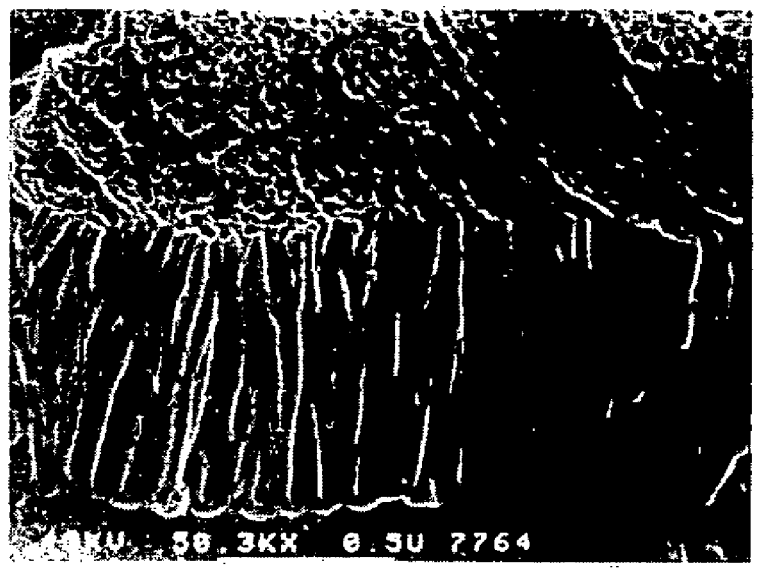
FIG. 9 is a schematic diagram depicting another kind of applicable porous material layer, wherein the porous material layer is a porous metal that has been anodized.
Figure 10:
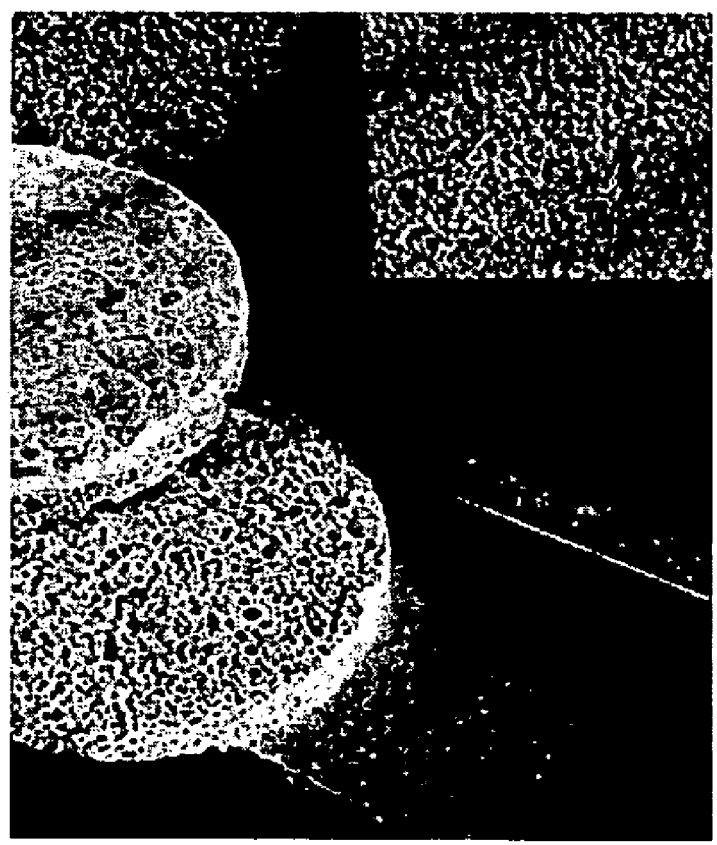
FIG. 10 is a schematic diagram depicting yet another kind of applicable porous material layer, wherein the porous material layer is a foam metal.

The porous material layer 11 can, for example, be a porous ceramic (as shown in FIGS. 8a and 8b), roughened ceramic or metal after etching or manufacturing, oxidized film with rough surface formed by anodic treatment (as shown in FIG. 9), metal foam such as aluminum foam (as shown in FIG. 10) and other equivalent elements that acts as a substrate for a package and has a large surface area contacting the air, thereby enhancing air convection for overall heat dissipation.

The thermal conductive layer 13 is disposed on the top surface of the porous material layer 11, and can be made of materials such as copper, aluminum, graphite and other equivalent materials with high thermal conductivity and electrical conductivity. The thermal conductive layer 13 is provided with a receiving portion 131 and an insulating portion 133 separating the thermal conductive layer 13 into two regions insulated from each other. The receiving portion 131 is for example a bowl-shaped structure, but it is not limited to this. The receiving portion 131 can act as an electrode to be connected to an external power supply. The insulating portion 133 is for example a slit, separating the receiving portion 131 (i.e. electrodes) into two (i.e. into positive and negative electrodes or a die bonding face and a conductive line connecting face), which are respectively connected to independent die bonding face and conductive line connecting face of the receiving portion separated by the insulating portion 133 via conductive line (e.g. a gold wire). In this embodiment, the die bonding face can be the surface of the receiving portion 131 where the chip 15 is disposed (i.e. left part of the insulating portion 133 in FIG. 7 as viewed), whereas the conductive line connecting face is then the surface of the receiving portion 131 opposite the die bonding face and separated by the insulating portion 133 (i.e. right part of the insulating portion 133 in FIG. 7 as viewed).

In this embodiment, the bowl-shape receiving portion 131 (i.e. electrodes) and the trace pattern for the insulating portion 133 can be formed on the thermal conductive layer 13 by selecting a suitable material (e.g. copper, aluminum, graphite etc.) and performing etching or mechanical processing thereon. The thermal conductive layer 13 is formed into an electrically conductive heat spreading layer, but it is not limited to this. Since the abovementioned processing is conventional, it will not be further described. The structure of the thermal conductive layer 13 is not limited to that shown in this embodiment, but may be varied.

The chip 15 can for example be a typical LED chip or flip chip with a first-type electrode and a second-type electrode, but it is not limited to these. The chip is provided in the receiving portion 131 of the thermal conductive layer 13, i.e. the receiving portion 131 provides a platform for disposing the chip. The chip 15 can be a single-crystal chip with a single wavelength or a polycrystalline chip with multiple wavelengths.

In contrast to the prior art, this embodiment uses the porous material layer 11 as the substrate, heat generated due to operation of the chip can be conducted in all directions by the underlying thermal conductive layer 13 with higher thermal conductivity, and the heat can then be convected by the porous material layer 11 underneath the thermal conductive layer 13, thereby reducing the temperature of the chip. In this manner, the thermal conductive layer 13 acts as a current path as well as a heat propagation media, conducting the heat generated from the chip 15 to the porous material layer 11, which then convects the heat outside, thus achieving high heat dissipation by the effect of high heat convection.

Therefore, compared to the prior art, the porous material layer of the present invention increases the air-contacting surface area, speeding the dissipation of heat conducted by the thermal conductive layer. The present invention achieves high thermal conductivity as well as high heat convection, greatly improving heat dissipating efficiency. Meanwhile, the design of the present invention does not require the addition of large-size element or other high thermal conductive material, so more space can be conserved, cost can be reduced and small-size applications can be enabled.

Thus, the present invention not only increases the air-contacting surface area, but also achieves high thermal conductivity and high heat convection, solving the shortcomings in the prior art, enabling small-size applications and enhancing its industrial value.

Second Embodiment

Figure 11:
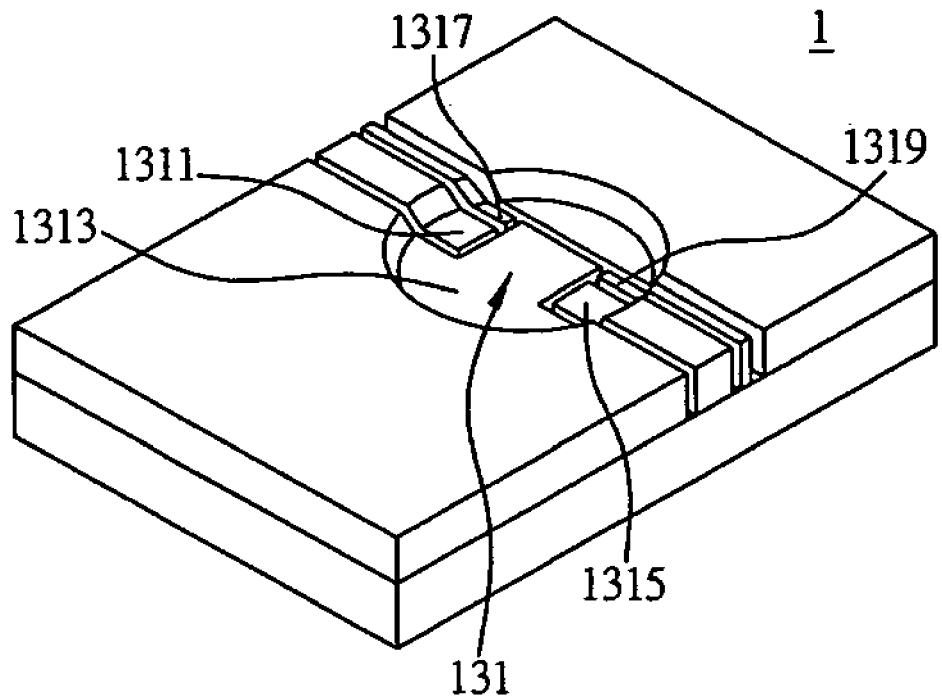
FIG. 11 is a schematic diagram of the second embodiment of the present invention.

FIG. 11 is a diagram depicting a high power LED according to a second embodiment of the present invention, in which, elements that are similar or the same as those in the first embodiment are denoted similar or the same symbols, and descriptions thereof are omitted.

The major difference between the first embodiment and the second embodiment is in that the high power LED 1 of the first embodiment has a double-electrode design, while the LED of the second embodiment has a multiple-electrode design.

As shown in FIG. 11, the thermal conductive layer 13 is provided with a plurality of insulating portions 133, separating the thermal conductive layer 13 into many insulated regions. In this embodiment, the insulating portions 133 separates the receiving portion 131 into five electrodes 1311, 1313, 1315, 1317 and 1319 for polycrystalline use. It should be noted that although the receiving portion 131 is separated into five electrodes 1311 to 1319 by the insulating portions 133 in this embodiment, but the actual number of electrodes is not limited to this, but can be varied. Meanwhile, preferably, an insulating material (e.g. air, gel, ceramic or other equivalent insulating materials) can be filled into the insulating portions 133 to prevent electrical conduction between electrodes. The insulating portions 133 can also be filled and leveled up to avoid overflow of subsequent packaging gel (not shown here but will be illustrated later) used as a light pervious insulating layer.

Third Embodiment

Figure 12:
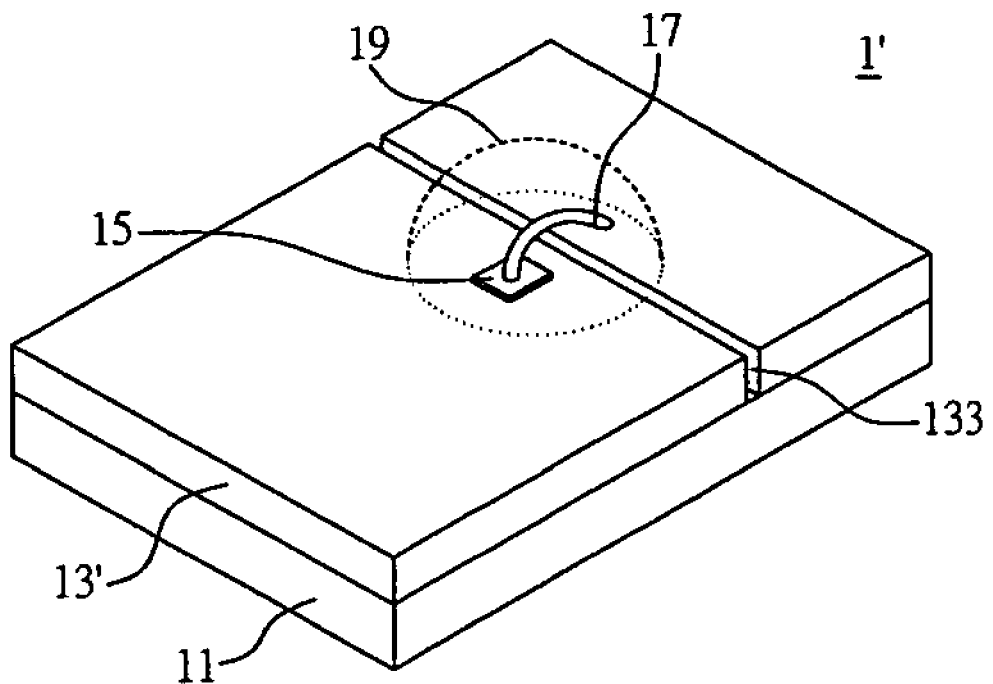
FIG. 12 is a schematic diagram of the third embodiment of the present invention.

FIG. 12 is a diagram depicting a high power LED 1' according to a third embodiment of the present invention, in which, elements that are similar or the same as those in the previous embodiments are denoted similar or the same symbols, and descriptions thereof are omitted.

The major difference between the third embodiment and the previous embodiments is in that the third embodiment is formed with a thermal conductive layer 13' with high thermal conductivity and electrical conductivity stacked on top of the porous material layer (an insulating layer in this embodiment) made of a material such as copper, silver, gold, aluminum or other equivalent materials by thermal vapor deposition, sputtering, coating or other equivalent methods.

As shown in FIG. 12, the high power LED 1' may also be manufactured with trace pattern for double or multiple electrodes (receiving portion 131 and insulating portion(s) 133 in the previous embodiments) by method such as a photolithographic or mechanical processing. In this embodiment, the double-electrode architecture is used for illustration, wherein, the chip 15 is first adhered to one of the electrodes of the thermal conductive layer 13', and then the chip 15 is connected to the other electrode of the thermal conductive layer 13' via a gold wire 17. Thereafter, the chip 15 and the gold wire are encapsulated by packaging gel 19 acting for example as a light pervious insulating layer using gel dispensing unit, printing head, injecting or other equivalent methods. The packaging gel 19 can for example be epoxy, silicone or other suitable material. The bonding and encapsulating processes are well known to those with ordinary skill in the art, so they will not be described in order not to obscure the present invention.

Fourth Embodiment

Figure 13:
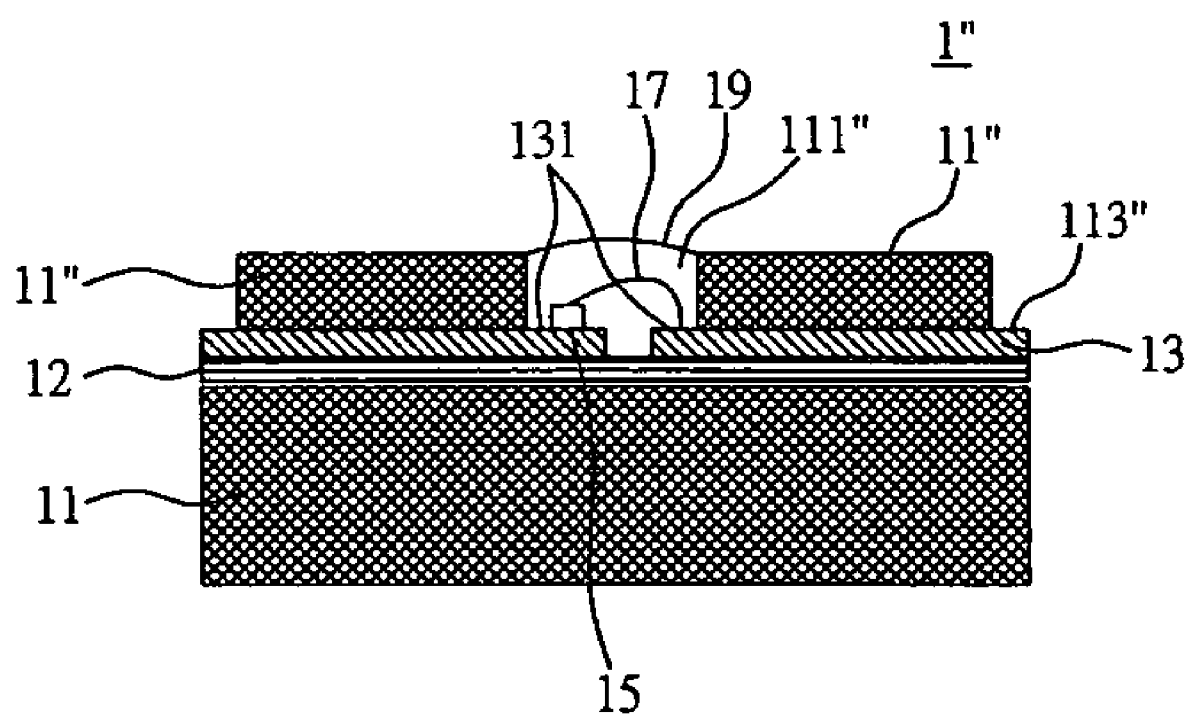
FIG. 13 is a schematic diagram of the fourth embodiment of the present invention.

FIG. 13 is a diagram depicting a high power LED 1" according to a fourth embodiment of the present invention, in which, elements that are similar or the same as those in the previous embodiments are denoted similar or the same symbols, and descriptions thereof are omitted.

The major difference between the fourth embodiment and the previous embodiments is in that porous material layers are disposed on the top and bottom of the thermal conductive layer in the fourth embodiment.

As shown in FIG. 13, the high power LED 1" includes a first porous material layer 11 as the substrate, a thermal conductive layer 13 on the surface of the porous material layer 11, a chip 15 disposed on the thermal conductive layer 13 and a second porous material layer 11" partially covering the thermal conductive layer on a surface thereof away from the first porous material layer 11. An interface layer 12 can be further provided between the first porous material layer 11 and the thermal conductive layer 13 for adhering the two layers 11 and 13. The interface layer 12 can for example be epoxy, silver gel, thermal conductive gel or adhesive made of other materials. Alternatively, metal such as indium, tin, gold or other equivalent materials can be formed between the first porous material layer 11 and the thermal conductive layer 13 as the interface layer 12 in bump form or by vapor deposition, sputtering, coating or other equivalent methods and applying supersonic, heating, pressurizing or other equivalent methods for adhesion. Meanwhile, although in this embodiment, one of the porous material layers is adhered to the thermal conductive layer and the other one is combined with the thermal conductive layer by other methods (e.g. those described in the previous embodiments); but the first and second porous material layers 11 and 11" can both be adhered to the thermal conductive layer 13 via interface layers 12. Such variations are regarded to be obviously conceived by those with ordinary skills in the art.

It should be noted that one of the porous material layer (the second porous material layer 11" in this embodiment) needs to have an opening to expose the chip 15, the gold wire 17, the receiving portion 131 for receiving the chip 15 and as the wire-bonding region and the electrode region 113" for external electrical connection. After encapsulation, packaging gel 19 can be formed.

Since the porous material layers 11 and 11" are formed on either sides of the thermal conductive layer 13, thus more areas are available for air contact, further improving thermal conductivity and heat convection. Meanwhile, the thermal conductive layer 13 and the porous material layers 11 and 11" can be very thin film, thus size is not substantially increased.

Modification

This modification is an example of modifying the prior-art structure according to the principles of the present invention, in which, elements that are similar or the same to those in the previous embodiments or the prior art are denoted similar or the same symbols, and descriptions thereof are omitted.

Figure 1:
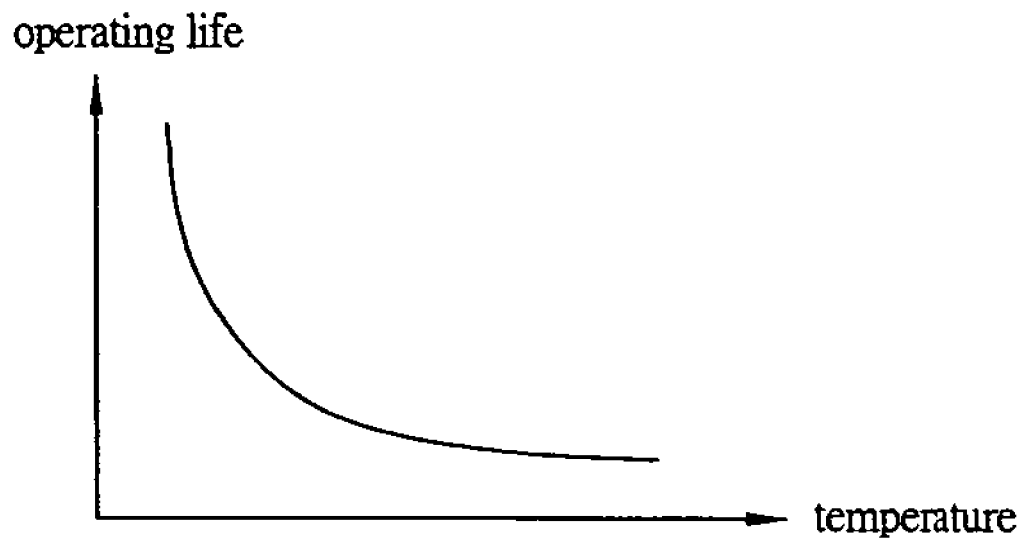
FIG. 1 (PRIOR ART) shows a relationship between temperature and operating life of LEDs.
Figure 2:
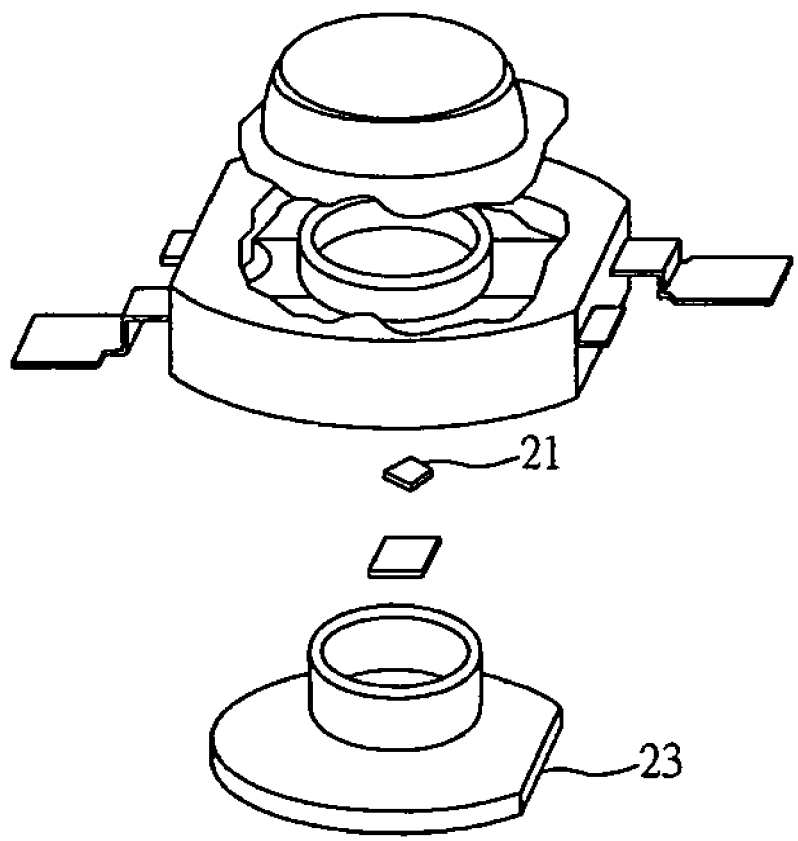
FIG. 2 (PRIOR ART) is a schematic diagram of the structure of U.S. Pat. No. 6,274,924.
Figure 3:
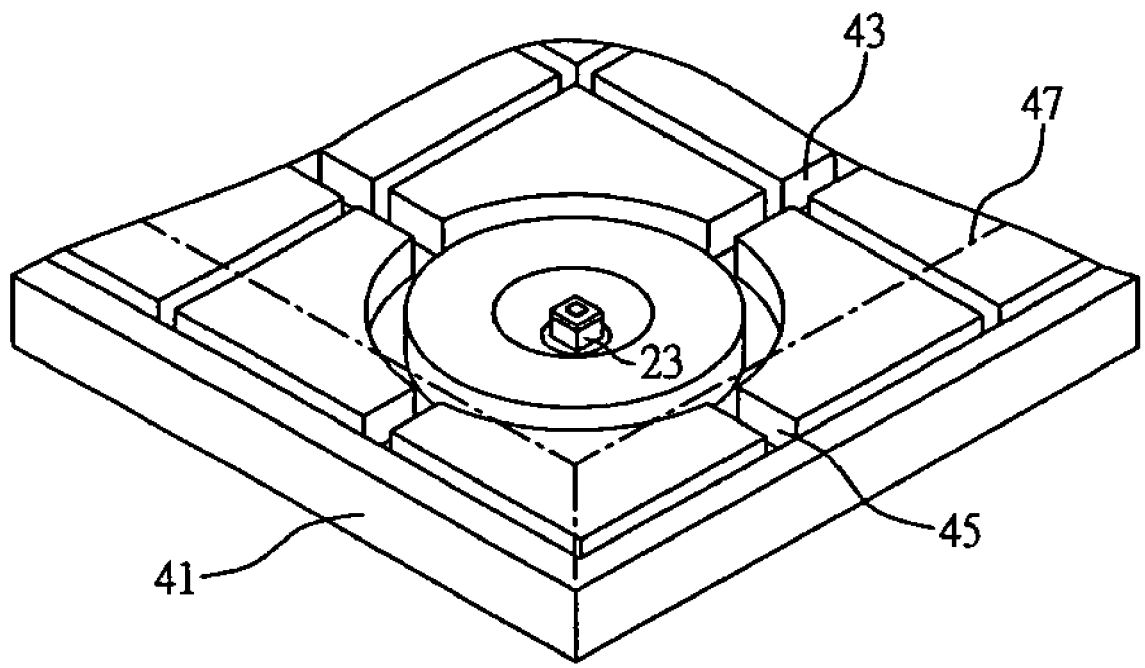
FIG. 3 (PRIOR ART) is a schematic diagram of the structure of U.S. Pat. No. 6,830,496.
Figure 4:
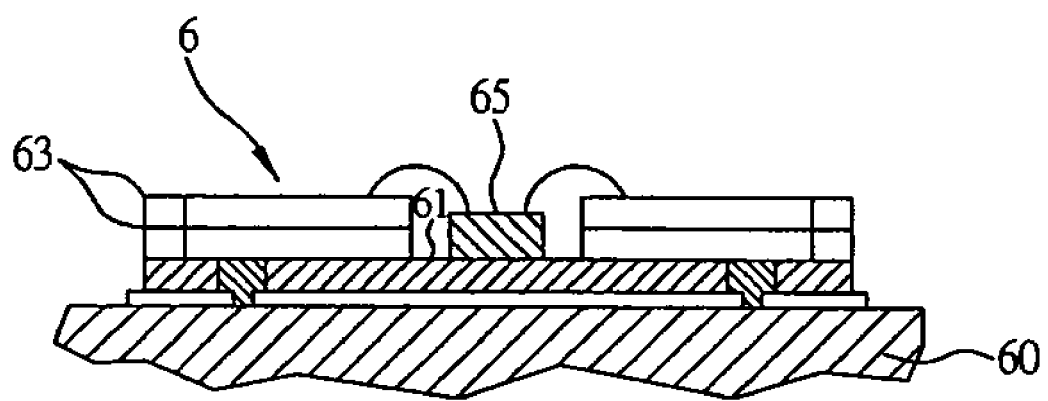
FIG. 4 (PRIOR ART) is a schematic diagram of the structure of U.S. Pat. No. 6,739,047.
Figure 5:
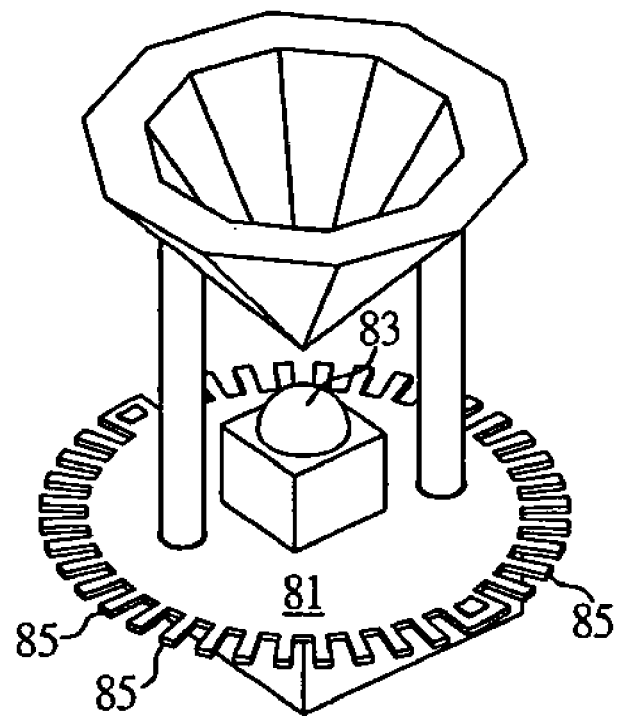
FIG. 5 (PRIOR ART) is a schematic diagram of the structure of U.S. Pat. No. 6,637,921.
Figure 6:
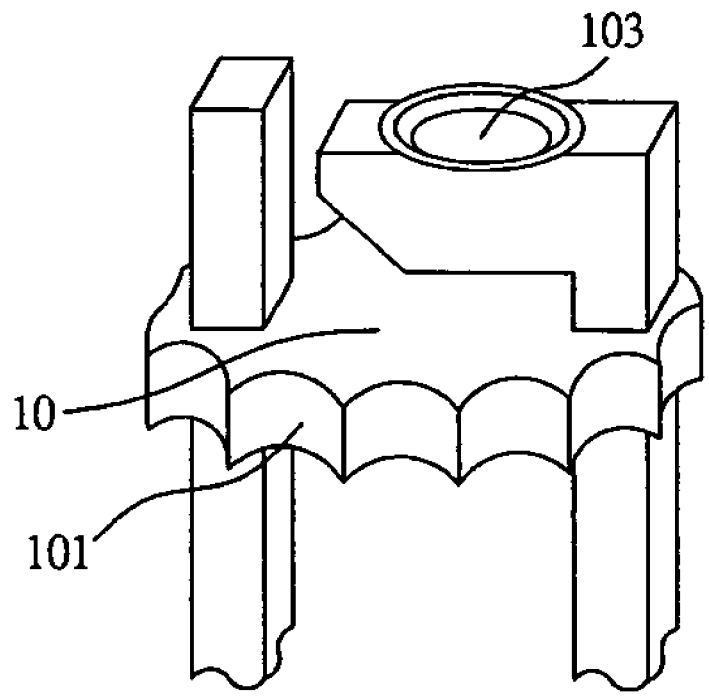
FIG. 6 (PRIOR ART) is a schematic diagram of the structure of U.S. Pat. No. 6,084,252.

The principles of the present invention can be applied to the main heat dissipating paths and the air-contact faces of a conventional package, such as the bottom of slug 23 in FIG. 2, the surface of the slug 41 in FIG. 3, the bottom of the motherboard 60 in FIG. 4 and the bottom of the heat dissipating element 10 in FIG. 6, by forming concave-convex porous structures as those described in the above embodiments thereon by methods such as mechanical processing or etching to increase the air-contact area and thus the heat convection.

Of course the porous material layer can, for example, be adhered to the main heat dissipating paths and air-contact faces of the bottom of slug 23 in FIG. 2, the surface of the slug 41 in FIG. 3, the bottom of the motherboard 60 in FIG. 4 and the bottom of the heat dissipating element 10 in FIG. 6. Alternatively, metal such as indium, tin, gold or other equivalent materials can be formed on the porous material layer as the interface layer in the fourth embodiment by using adhesive such as epoxy, silver gel, thermal conductive gel or other equivalent ones or by vapor deposition, sputtering, coating or other equivalent methods or in bump form and applying supersonic, heating, pressurizing or other equivalent methods for adhesion.

It can be known that the high power LED structure of the present invention increases contact area with the air and achieving high thermal conductivity and high heat convection. Furthermore, there is no difficulty in terms of manufacturing the structure illustrated in the present invention or improving the conventional structure using the principles of the present invention. Thus, users may apply the present invention according to actual needs. The present invention is more flexible in design and more inventive over the prior art.

Moreover, the above porous material layer is advantageous in having a concave-convex structure that has a surface area in one unit area of projecting plane range larger than twice the unit area. The porous material layer can be selected from porous ceramic material, foam metal material, metal oxide (e.g. aluminum oxide) and combinations thereof or other, equivalent materials. Moreover, metal or ceramic material made by mechanical processing or etching can be used as the porous material layer. In addition, the above thermal conductive layer is made of a conductive material that has a thermal conductivity larger than that of the porous material layer, and can be selected from metal material, graphite material, diamond-like carbon material or other equivalent material. The thermal conductive layer can be metal, silver, copper, aluminum, molybdenum, tungsten, iron, nickel, lead, graphite, diamond and composite thereof or other equivalent material.

In the case of polycrystalline design, more than one chip can be disposed on the die bonding face of the receiving portion of the thermal conductive layer. Furthermore, the first-type electrode and second-type electrode of each of the chips can be formed on the same side where the chip is formed and on an uneven surface, or on a different side from where the chip is formed and in which the electrode is connected to corresponding leads via wires. Although the thermal conductive layer is formed on the top surface of the porous material layer in the first to third embodiments, the thermal conductive layer may also be formed on the bottom surface thereof in other embodiments, such that air convection can be made by the porous material layer(s) on the top and/or bottom of the thermal conductive layer. Such changes can be easily conceived by those with ordinary skills in the art.

In summary, the present invention allows the heat dissipating path and air contact area of LEDs to be increased, meanwhile, high thermal conductivity, high heat convection and small-size applications can be achieved. In addition, the present invention can be used to make new design or applied to existing configuration. Thus, the present invention has a more flexible design and more industrial value than the prior art.

The above embodiments are only used to illustrate the principles of the present invention, and they should not be construed as to limit the present invention in any way. The above embodiments can be modified by those with ordinary skills in the arts without departing from the scope of the present invention as defined in the following appended claims.

What is claimed is:

1. A high power light emitting diode (LED), comprising:
a first porous material layer;
a thermal conductive layer disposed on a surface of the first porous material layer;
a second porous material layer (a) that is disposed on the thermal conductive layer, on a side thereof opposite the first porous material layer and not in contact with the first porous material layer, to partially cover the thermal conductive layer, and (b) that has an opening defined therein,
a chip disposed on the thermal conductive layer within the opening defined in the second porous material layer so that the chip is exposed to contact with air, and
an interface layer provided between the second porous material layer and the thermal conductive layer for adhering the second porous material layer and the thermal conductive layer together,
wherein the first porous material layer and the second porous material layer are composed of a porous ceramic material, and the interface layer comprises at least one bump.

2. The high power LED of claim 1, wherein the second porous material layer has a concave-convex structure which has a surface area that is at least twice as large as that of a non-concave-convex structure.

3. The high power LED of claim 1, wherein the thermal conductive layer is made of an electrically conducting material that has a thermal conductivity larger than that of the first and second porous material layers.

4. The high power LED of claim 1, wherein the thermal conductive layer is composed of a material selected from the group consisting of a metal material, a graphite material and a diamond-like carbon material.

5. The high power LED of claim 1, wherein the thermal conductive layer is composed of a material selected from the group consisting of gold, silver, copper, aluminum, molybdenum, tungsten, iron, nickel, lead, graphite, diamond and composites thereof.

6. The high power LED of claim 1, wherein the second porous material layer further comprises an electrode region for external circuit connection.

7. The high power LED of claim 1, wherein the interface layer is made of an adhesive selected from the group consisting of epoxy material, silver gel and thermal conductive gel.

8. The high power LED of claim 1, wherein the interface layer is a metal material selected from the group consisting of indium, tin and gold formed by a method selected from the group consisting of vapor deposition, sputtering and coating.

9. The high power LED of claim 1, further comprising an interface layer provided between the first porous material layer and the thermal conductive layer for adhering the first porous material layer and the thermal conductive layer together.

10. The high power LED of claim 1, wherein the thermal conductive layer comprises a receiving portion as a platform for receiving the chip and an insulating portion for separating the thermal conductive layer into at least two insulated regions.

11. The high power LED of claim 10, wherein the receiving portion has a bowl shape.

12. The high power LED of claim 10, wherein the insulating portion is a slit.

13. The high power LED of claim 10, wherein the receiving portion is separated into a plurality of electrodes by the insulating portion for polycrystalline use.

14. The high power LED of claim 13, further comprising at least one electrode region defined on exposed regions of the thermal conductive layer; at least one electrode; and a gold wire for connecting the chip to at least one electrode.

15. The high power LED of claim 14, further comprising a light pervious insulating layer for encapsulating the chip and the gold wire.

16. The high power LED of claim 15, wherein the light pervious insulating layer is a packaging gel.

17. The high power LED of claim 1, further comprising an interface layer provided between the first porous material layer and the thermal conductive layer for adhering the first porous material layer and the thermal conductive layer together.

18. The high power LED of claim 17, wherein the interface layer is made of an adhesive selected from the group consisting of epoxy material, silver gel and thermal conductive gel.

19. The high power LED of claim 17, wherein the interface layer comprises at least one bump.

20. The high power LED of claim 17, wherein the interface layer is a metal material selected from the group consisting of indium, tin and gold formed by a method selected from the group consisting of vapor deposition, sputtering and coating.

* * * * *